(12) United States Patent
Tsutsumi et al.

(10) Patent No.: US 10,008,646 B2
(45) Date of Patent: Jun. 26, 2018

(54) HEAT-CURABLE EPOXY RESIN COMPOSITION FOR OPTICAL SEMICONDUCTOR ELEMENT ENCAPSULATION AND OPTICAL SEMICONDUCTOR DEVICE USING SAME

(71) Applicant: SHIN-ETSU CHEMICAL CO., LTD., Tokyo (JP)

(72) Inventors: Yoshihiro Tsutsumi, Annaka (JP); Tadashi Tomita, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 20 days.

(21) Appl. No.: 15/209,542

(22) Filed: Jul. 13, 2016

(65) Prior Publication Data

US 2017/0018693 A1    Jan. 19, 2017

(30) Foreign Application Priority Data

Jul. 14, 2015    (JP) .................................. 2015-140634

(51) Int. Cl.
| | |
|---|---|
| *C08G 59/38* | (2006.01) |
| *H01L 33/56* | (2010.01) |
| *C08L 63/00* | (2006.01) |
| *C08G 59/32* | (2006.01) |
| *C08G 59/42* | (2006.01) |

(52) U.S. Cl.
CPC .......... *H01L 33/56* (2013.01); *C08G 59/3281* (2013.01); *C08G 59/4215* (2013.01); *C08L 63/00* (2013.01)

(58) Field of Classification Search
CPC . C08G 59/3281; C08G 59/4215; H01L 33/56; C08L 63/00
USPC ........................................................ 523/427
See application file for complete search history.

(56) References Cited

U.S. PATENT DOCUMENTS

| | | | | |
|---|---|---|---|---|
| 2008/0255283 A1* | 10/2008 | Aoki | ...................... | H01L 23/293 524/300 |
| 2009/0258992 A1* | 10/2009 | Yamamoto | ........... | C08G 59/306 524/588 |
| 2013/0131216 A1 | 5/2013 | Sakane | | |

FOREIGN PATENT DOCUMENTS

| | | | |
|---|---|---|---|
| EP | 2141201 A1 | 1/2010 | |
| EP | 2289998 A1 | 3/2011 | |
| EP | 2832760 A1 | 2/2015 | |
| JP | 7-309927 A | 11/1995 | |
| JP | 9-213997 A | 8/1997 | |
| JP | 2000-196151 A | 7/2000 | |
| JP | 2012222229 A * | 11/2012 | ............. H01L 23/29 |
| JP | 5319567 B2 | 10/2013 | |
| JP | 5675230 B2 | 2/2015 | |

OTHER PUBLICATIONS

Tatsumi et al., JP 2012-222229 A machine translation in English, Nov. 12, 2012 (Year: 2012).*
Extended European Search Report dated Nov. 16, 2016, for European Application No. 16179426.8.

* cited by examiner

*Primary Examiner* — David T Karst

(74) *Attorney, Agent, or Firm* — Birch, Stewart, Kolasch & Birch, LLP

(57) ABSTRACT

A heat-curable epoxy resin composition for optical semiconductor element encapsulation capable of being pressure molded and transfer molded under room temperature, comprising:

(A) a prepolymer obtained by reacting at least one component of (A-1), (A-2) and (A-3); and (A-4), (A-1) a triazine derivative epoxy resin having not less than three epoxy groups in one molecule, (A-2) at least one epoxy resin that is non-fluid at 25° C. and selected from the group consisting of a bisphenol-type epoxy resin, a hydrogenated bisphenol-type epoxy resin, an alicyclic epoxy resin and monoalkyl diglycidyl isocyanurate, (A-3) a cyclic siloxane compound having not less than two epoxy groups in one molecule, and (A-4) an acid anhydride curing agent in a liquid state at 25° C.;

(A') a component(s) among (A-1) to (A-3) that is/are not used in said prepolymer (A); and (B) a curing accelerator.

4 Claims, No Drawings

HEAT-CURABLE EPOXY RESIN COMPOSITION FOR OPTICAL SEMICONDUCTOR ELEMENT ENCAPSULATION AND OPTICAL SEMICONDUCTOR DEVICE USING SAME

BACKGROUND OF THE INVENTION

Field of the Invention

The present invention relates to a heat-curable epoxy resin composition for optical semiconductor element encapsulation; and an optical semiconductor device obtained by encapsulating an optical semiconductor element(s) using the same.

Background Art

Optical semiconductor elements such as LEDs (Light Emitting Diode) have been used in various indicators and light sources such as those for street displays, automobile lamps and residential lightings. Moreover, products using such optical semiconductor element are being rapidly developed in many fields such that carbon dioxide reduction and energy conservation are made available.

As an encapsulation material for encapsulating various optical semiconductor elements such as LEDs, there has long been used a heat-curable epoxy resin containing an epoxy resin such as a bisphenol A-type epoxy resin and/or an alicyclic epoxy resin; and an acid anhydride-based curing agent (JP-A-Hei 7-309927). This is because such heat-curable epoxy resin is low in cost, but is capable of forming a cured product superior in transparency, moisture resistance, heat resistance and light resistance.

In recent years, LEDs have become high-powered and highly bright, which requires an encapsulation material to be high-temperature resistant and light resistant. Therefore, it has become a trend to use a multifunctional epoxy resin and/or an alicyclic epoxy resin as an encapsulation material. However, a problem with these epoxy resins used as an encapsulation agent is that resin cracks will easily occur when using such epoxy resins to mold an optical semiconductor element(s). The reason for that is because these epoxy resins easily exhibit a decrease in strength due to their backbone structures (JP-A-Hei 9-213997 and JP-A 2000-196151).

As a solution to such problem, there has been reported an epoxy resin composition comprising a flexibility imparting agent such as polycarbonate polyol and polyester polyol. Although these epoxy resin compositions contribute to improving a reflow resistance, their physical properties tend to exhibit a decreased elastic modulus in a high-temperature state (Japanese Patent No. 5319567 and Japanese Patent No. 5675230).

Meanwhile, there exists a production method of a lamp for an automobile or the like where an optical semiconductor element on a lead frame is to be encapsulated and molded by an epoxy resin into the shape of a lens, followed processing such lead frame and then performing secondary molding through injection molding of a thermoplastic resin. There, since the thermoplastic resin will be heated to nearly 300° C. when performing secondary molding, an epoxy resin composition may be washed away by such thermoplastic resin if the epoxy resin composition exhibits low strength and elastic modulus in a high-temperature state. Further, when a glass-transition temperature is low, an epoxy resin cured product may directly reach a rubber state, which may cause the lens-shaped cured product to be washed away.

SUMMARY OF THE INVENTION

Therefore, it is an object of the present invention to provide a heat-curable epoxy resin composition for optical semiconductor element encapsulation capable of being handled easily and transfer molded, and its cured product is capable of exhibiting a high transparency, being tough and superior in crack resistance at room temperature and having a high strength and elastic modulus in a high-temperature state. It is also an object of the present invention to provide an optical semiconductor device obtained by encapsulating an optical semiconductor element(s) with such heat-curable epoxy resin composition.

The inventors of the present invention diligently conducted a series of studies to solve the aforementioned problems, and found that the present invention could meet the above objectives as follows. That is, the inventors completed the invention based on a finding that a heat-curable epoxy resin composition whose essential components were a prepolymer and a curing accelerator can be pressure molded and transfer molded at room temperature, and further bring about a toughness, a superior crack resistance, a high transparency, and a high strength and elastic modulus in a high-temperature state, such prepolymer being obtained by reacting a particular triazine derivative epoxy resin, an epoxy resin non-fluid at 25° C., a cyclic siloxane compound and an acid anhydride curing agent.

In short, the present invention is to provide the following heat-curable epoxy resin composition for optical semiconductor element encapsulation; and an optical semiconductor device obtained by encapsulating an optical semiconductor element(s) such as a light receiving element(s) with such heat-curable epoxy resin composition.

[1]

A heat-curable epoxy resin composition for optical semiconductor element encapsulation capable of being pressure molded and transfer molded under room temperature, comprising:

(A) a prepolymer obtained by reacting at least one component of (A-1), (A-2) and (A-3); and (A-4),
  (A-1) a triazine derivative epoxy resin having not less than three epoxy groups in one molecule,
  (A-2) at least one epoxy resin that is non-fluid at 25° C. and selected from the group consisting of a bisphenol-type epoxy resin, a hydrogenated bisphenol-type epoxy resin, an alicyclic epoxy resin and monoalkyl diglycidyl isocyanurate,
  (A-3) a cyclic siloxane compound having not less than two epoxy groups in one molecule, and
  (A-4) an acid anhydride curing agent which is an acid anhydride curing agent in a liquid state at 25° C.; or a liquid mixture prepared by dissolving an acid anhydride in a solid state at 25° C. into an acid anhydride in a liquid state at 25° C.,
  wherein a ratio of a total number of epoxy groups in (A-1), (A-2) and (A-3) to a total number of acid anhydride groups in (A-4) is 0.6 to 2.0;
(A') a component(s) among (A-1) to (A-3) that is/are not used in the prepolymer (A); and
(B) a curing accelerator.

[2]

The heat-curable epoxy resin composition for optical semiconductor element encapsulation according to [1], wherein the prepolymer (A) is obtained by reacting at least one component of (A-1), (A-2) and (A-3); (A-4); and an antioxidant as a component (C).

[3]

The heat-curable epoxy resin composition for optical semiconductor element encapsulation according to [1], wherein the prepolymer (A) is obtained by reacting at least one component of (A-1), (A-2) and (A-3); (A-4); and an acrylic block copolymer as a component (D).

[4] The heat-curable epoxy resin composition for optical semiconductor element encapsulation according to [1], wherein the prepolymer (A) is obtained by reacting at least one component of (A-1), (A-2) and (A-3); (A-4); an antioxidant as a component (C); and an acrylic block copolymer as a component (D).

[5] The heat-curable epoxy resin composition for optical semiconductor element encapsulation according to [1], further comprising an antioxidant as a component (C).

[6] The heat-curable epoxy resin composition for optical semiconductor element encapsulation according to [1], further comprising an acrylic block copolymer as a component (D).

[7] An optical semiconductor device having an optical semiconductor element encapsulated by the heat-curable epoxy resin composition for optical semiconductor element encapsulation as set forth in any one of [1] to [6].

The heat-curable epoxy resin composition for optical semiconductor element encapsulation of the invention can be pressure molded and transfer molded at room temperature; and brings about a toughness, a superior crack resistance, a high transparency, and a high strength and elastic modulus in a high-temperature state. Accordingly, an optical semiconductor device will possess superior properties as a result of having an optical semiconductor element(s) such as a light receiving element(s) encapsulated by the composition exhibiting the above features.

DETAILED DESCRIPTION OF THE INVENTION

The present invention is described in greater detail hereunder.

(A) Prepolymer (A-1) Triazine Derivative Epoxy Resin Having not Less than Three Epoxy Groups in One Molecule As a component (A-1) of the invention, a triazine derivative epoxy resin having not less than three epoxy groups in one molecule is capable of bringing about the following effects. That is, when reacted with the following components (A-2), (A-3) and (A-4) at particular ratios, the component (A-1) is capable of, in a high-temperature state, improving the strength and restricting yellowing of a cured product of a heat-curable epoxy resin composition containing as a resin component a reactant obtained through such reaction; and realizing a semiconductor light emitting device exhibiting a small degree of deterioration with time. It is preferred that such triazine derivative epoxy resin be a 1,3,5-triazine nucleus derivative epoxy resin. Particularly, an epoxy resin having an isocyanurate ring is superior in light resistance and electrical insulation property, and it is preferred that such epoxy resin have a trivalent epoxy group with respect to one isocyanurate ring. Specifically, there may be used, for example, tris (2,3-epoxypropyl) isocyanurate and tris (α-methylglycidyl) isocyanurate.

It is preferred that the triazine derivative epoxy resin (A-1) having not less than three epoxy groups in one molecule have a softening temperature of 95 to 125° C. When such triazine derivative epoxy resin has a softening temperature higher than 125° C., it may impair the solubilities with other components depending on a ratio of isomers of the component (A-1). It is preferred that the composition of the invention contain the component (A-1) by an amount of 15 to 50% by mass, more preferably 18 to 48% by mass, or even more preferably 20 to 45% by mass.

(A-2) Epoxy Resin Other than Component (A-1), Non-Fluid at 25° C.

As a component (A-2) of the composition of the invention, there is used at least one epoxy resin selected from the group consisting of a bisphenol-type epoxy resin, a hydrogenated bisphenol-type epoxy resin, an alicyclic epoxy resin and monoalkyl diglycidyl isocyanurate.

The components (A-1) and the later described (A-3) and (A-4) alone will often make it difficult to perform pressure molding on the epoxy resin composition under a room temperature, and lead to an impaired mechanical strength of the cured product. By adding the component (A-2), handling property of the epoxy resin composition and prepolymerization of component (A) can be improved. In order to realize an easy handling and an easy prepolymerization, it is preferred that the component (A-2) be non-fluid at 25° C., and that the softening temperature of such epoxy resin be 30 to 100° C.

It is preferred that the component (A-2) be added in an amount of 11 to 100 parts by mass, particularly 20 to 80 parts by mass with respect to 100 parts by mass of the component (A-1). As mentioned above, when the component (A-2) is added in an amount smaller than 11 parts by mass with respect to 100 parts by mass of the component (A-1), it will often be difficult to perform pressure molding on the epoxy resin composition under a room temperature. Meanwhile, if the component (A-2) is added in an amount larger than 100 parts by mass with respect to 100 parts by mass of the component (A-1), a heat resistance and light resistance of the cured product may be impaired.

(A-3) Cyclic Siloxane Compound Having not Less than Two Epoxy Groups in One Molecule As a component (A-3) of the invention, there is used a cyclic siloxane compound having not less than two epoxy groups in one molecule. The component (A-3) causes the cured product of the composition of the invention to improve its heat resistance such that a strength and elastic modulus thereof in a high-temperature state can be improved as well. Further, the component (A-3) is also capable of improving a light resistance of the cured product, thus restricting a decrease in luminance of the optical semiconductor device.

Although examples of the structure of a siloxane compound include a cyclic structure, a linear structure, a cage structure and a ladder structure, the present invention employs a cyclic siloxane compound having an epoxy group(s). A cured product of a siloxane compound having a structure other than a cyclic structure can easily become clouded due to the influence of its compatibility, and thus there is a high possibility that such cured product may not exhibit a degree of transparency required. Thus, a siloxane compound having a structure other than a cyclic structure is not preferred. Here, one cyclic siloxane compound having not less than two epoxy groups in one molecule may be used singularly, or two or more of such cyclic siloxane compounds may be used in combination.

With regard to the cyclic siloxane compound having not less than two epoxy groups in one molecule, no particular restriction is imposed on the number of the silicon atoms composing a siloxane ring. However, it is preferred that such number (equal to the number of the silicon atoms composing the siloxane ring) be 2 to 12, more preferably 4 to 8, in terms of improving the heat resistance and light resistance of the cured product.

There are no particular restrictions on the weight-average molecular weight of the cyclic siloxane compound having not less than two epoxy groups in one molecule. However, it is preferred that such weight-average molecular weight be 100 to 2,500, more preferably 180 to 2,000, in terms of, for example, compatibility with the components (A-1), (A-2) and (A-4).

There are no particular restrictions on the number of the epoxy groups in each molecule of the cyclic siloxane compound having not less than two epoxy groups in one molecule as long as such number is two or more. However, it is preferred that the number be 2 to 4 in terms of, for example, compatibility with the components (A-1), (A-2) and (A-4).

Further, there are no particular restrictions on the epoxy equivalent of the cyclic siloxane compound having not less than two epoxy groups in one molecule. However, it is preferred that such epoxy equivalent be 160 to 400, more preferably 180 to 380, or even more preferably 190 to 350, in terms of improving a glass-transition temperature.

There are no particular restrictions on the kinds of the epoxy groups in the cyclic siloxane compound having not less than two epoxy groups in one molecule. It is preferred that the epoxy groups be alicyclic epoxy groups, particularly preferably cyclohexene oxide groups, in terms of improving the heat resistance and light resistance of the cured product.

Specific examples of the cyclic siloxane compound having not less than two epoxy groups in one molecule, include
2,4-di[2-(3-{oxabicyclo[4.1.0]heptyl})ethyl]-2,4,6,6,8,8-hexamethyl-cyclotetrasiloxane;
4,8-di[2-(3-{oxabicyclo[4.1.0]heptyl})ethyl]-2,2,4,6,6,8-hexamethyl-cyclotetrasiloxane;
2,4-di[2-(3-{oxabicyclo[4.1.0]heptyl})ethyl]-6,8-dipropyl-2,4,6,8-tetramethyl-cyclotetrasiloxane;
4,8-di[2-(3-{oxabicyclo[4.1.0]heptyl})ethyl]-2,6-dipropyl-2,4,6,8-tetramethyl-cyclotetrasiloxane;
2,4,8-tri[2-(3-{oxabicyclo[4.1.0]heptyl})ethyl]-2,4,6,6,8-pentamethyl-cyclotetrasiloxane;
[2-(3-{oxabicyclo[4.1.0]heptyl})ethyl]-6-propyl-2,4,6,8-tetramethyl-cyclotetrasiloxane;
2,4,6,8-tetra[2-(3-{oxabicyclo[4.1.0]heptyl})ethyl]-2,4,6,8-tetramethyl-cyclotetrasiloxane; and silsesquioxane having an epoxy group(s).

It is preferred that the component (A-3) be added in an amount of 1 to 20% by mass, particularly preferably 3 to 10% by mass, with respect to a sum total of the components (A-1), (A-2), (A-3) and (A-4). An excessively small amount of the component (A-3) added makes it impossible to improve the strength and elastic modulus of the cured product in a high-temperature state. Further, an excessively large amount of the component (A-3) added makes solidification of the epoxy resin composition difficult, thereby making it difficult to not only form the epoxy resin composition into the shape of a tablet, but also perform transfer molding.

(A-4) Acid Anhydride in Liquid State at 25° C.

An acid anhydride as a component (A-4) of the invention is in a liquid state at 25° C., and serves as a curing agent. It is preferred that such acid anhydride have no carbon-carbon double bond, and be a non-aromatic group in terms of imparting the light resistance. It is quite often that an acid anhydride in a solid state at 25° C. has an aromatic ring(s) and a carbon-carbon double bond(s). Examples of an acid anhydride in a liquid state at 25° C. include hexahydrophthalic anhydride, methylhexahydrophthalic anhydride, trialkyltetrahydrophthalic anhydride and hydrogenated methylnadic anhydride, among which hexahydrophthalic anhydride and/or methylhexahydrophthalic anhydride are preferred. In fact, not only one kind, but two or more kinds of these acid anhydride-based curing agents may be used in combination. As the component (A-4), there may also be used an acid anhydride curing agent made of a liquid mixture prepared by dissolving an acid anhydride in a solid state at 25° C. into an acid anhydride in a liquid state at 25° C.

(A) Prepolymer Obtained by Reaction of Components (A-1) to (A-4)

When combining the components (A-1), (A-2), (A-3) and (A-4) to synthesize the prepolymer as the component (A), the acid anhydride as the component (A-4) is added in an amount at which all the epoxy groups in the components (A-1), (A-2) and (A-3) are preferably in an amount of 0.6 to 2.0 mol, more preferably 0.8 to 1.8 mol, or even more preferably 0.9 to 1.6 mol, with respect to 1 mol of the acid anhydride groups in the component (A-4). When the ratio of (molar number of all the epoxy groups in the components (A-1), (A-2) and (A-3))/(molar number of acid anhydride as component (A-4)) is less than 0.6, an unreacted curing agent may remain in the cured product, which may cause a moisture resistance of the cured product obtained to be degraded, and solidification under a room temperature may thus be difficult even after performing prepolymerization. Meanwhile, when such ratio is greater than 2.0, insufficient curing may occur, which may cause a reliability to be impaired.

Following are detailed reaction conditions for synthesizing the prepolymer as the component (A). That is, the components (A-1), (A-2), (A-3) and (A-4) are reacted at 60 to 120° C., preferably 70 to 110° C. for 3 to 20 hours, preferably 4 to 15 hours. At that time, any of the components (A-1), (A-2) and (A-3); and the component (A-4) may be prepolymerized in advance, followed by adding the rest of the components thereto. The target resin may also be synthesized by further adding the components described later. Also, the components may be added in any order. In this way, there can be obtained a prepolymer as a solid product having a softening temperature of 40 to 100° C., preferably 60 to 80° C. It is difficult for the composition of the invention to become solid when the softening temperature of the prepolymer is lower than 40° C., which also makes it difficult to perform pressure molding under a room temperature. A softening temperature greater than 100° C. causes gelatinization to take place in an excessively progressive manner such that there may not be achieved a fluidity as required to mold the composition.

(B) Curing Accelerator

A component (B) is a curing accelerator added to cure the component (A). Here, no particular limitation is imposed on such curing accelerator. In fact, there can be used a known curing accelerator as a curing catalyst for an epoxy resin composition. For example, there may be used at least one of tertiary amines, imidazoles, organic carboxylates of such tertiary amines and imidazoles; organic carboxylate metal salts; metal-organic chelate compounds; aromatic sulfonium salts; and phosphorous curing catalysts such as organic phosphine compounds and phosphonium compounds and salts thereof. Among the aforementioned substances, preferred are imidazoles and phosphorous curing catalysts, such as 2-ethyl-4-methylimidazole, methyltributylphosphonium-dimethylphosphate; and octylic acid salt of tertiary amine.

It is preferred that the curing accelerator as the component (B) be added in an amount of 0.05 to 5 parts by mass, particularly preferably 0.1 to 2 parts by mass with respect to the 100 parts by mass of the component (A). When the amount of the component (B) added is out of such range, a balance between the heat resistance and moisture resistance of the cured product of the epoxy resin composition may be impaired, or curing at the time of molding may take place either extremely fast or extremely slow.

(C) Antioxidant

An antioxidant as a component (C) can be added to the composition of the invention to improve an initial transmittance and maintain a transmittance over a long period of time. Such antioxidant as the component (C) may be a phenol-based, phosphorus-based or sulfur-based antioxidant. Specific examples of such antioxidant are as follows.

Examples of a phenol-based antioxidant include 2,6-di-t-butyl-p-cresol; butylated hydroxyanisole; 2,6-di-t-butyl-p-ethylphenol; stearyl-β-(3,5-di-t-butyl-4-hydroxyphenyl)propionate; 2,2'-methylenebis(4-methyl-6-t-butylphenol); 4,4'-butylidenebis(3-methyl-6-t-butylphenol); 3,9-bis[1,1-dimethyl-2-{β-(3-t-butyl-4-hydroxy-5-methylphenyl) propionyloxy}ethyl]2, 4,8,10-tetraoxaspiro[5,5]undecane; 1,1,3-tris(2-methyl-4-hydroxy-5-t-butylphenyl)butane; and 1,3,5-trimethyl-2,4,6-tris (3,5-di-t-butyl-4-hydroxybenzyl) benzene.

Examples of a phosphorous-based antioxidant include triphenyl phosphite, diphenylalkyl phosphite, phenyldialkyl phosphite, tri (nonylphenyl) phosphite, trilauryl phosphite, trioctadecyl phosphite, distearyl pentaerythritol diphosphite, tris (2,4-di-tert-butylphenyl) phosphite, diisodecyl pentaerythritol diphosphite, di (2,4-di-tert-butylphenyl) pentaerythritol diphosphite, tristearyl sorbitol triphosphite and tetrakis (2,4-di-tert-butylphenyl)-4,4'-biphenyl diphosphonate.

Examples of a sulfur-based antioxidant include dilauryl thiopropionate, distearyl thiodipropionate and dibenzyl disulfide.

In fact, not only one kind, but two or more kinds of these antioxidants may be used in combination. It is preferred that such antioxidant(s) be added in an amount of 0.01 to 10% by mass, particularly preferably 0.03 to 8% by mass, with respect to the component (A). If the amount of the antioxidant(s) added is extremely small, there cannot be achieved a sufficient heat resistance and light resistance, which may cause the cured product to discolor. If the amount of the antioxidant added is extremely large, curing inhibition will occur, which may result in a sufficient curability and strength, and the cured product may also discolor due to the deterioration of the antioxidant itself.

(D) Acrylic Block Copolymer

An acrylic block copolymer as a component (D) can be added to the composition of the invention to toughen the cured product and improve a crack resistance of the cured product. By adding an acrylic block copolymer, not only the cured product of the heat-curable epoxy resin composition can be toughened, and the crack resistance of such cured product can be improved; but a luminosity will not decrease easily even when an LED is of a high-brightness and high-powered type.

The acrylic block copolymer as the component (D) is a block copolymer whose essential monomer component is comprised of an acrylic monomer(s). Examples of such acrylic monomer include an (meth) acrylic acid alkyl ester such as methyl acrylate, ethyl acrylate, n-butyl acrylate, t-butyl acrylate, methyl methacrylate, ethyl methacrylate, n-butyl methacrylate, t-butyl methacrylate and stearyl methacrylate; a (meth) acrylic acid ester having an alicyclic structure, such as cyclohexyl acrylate and cyclohexyl methacrylate; a (meth) acrylic acid ester having an aromatic ring(s), such as benzyl methacrylate; an acrylic monomer having a carboxyl group(s) in each molecule, such as an acrylic acid, a methacrylic acid and a maleic acid; an acrylic monomer having a hydroxyl group(s) in each molecule, such as acrylic acid 2-hydroxyethyl, acrylic acid-2-hydroxypropyl, acrylic acid-4-hydroxybutyl, methacrylic acid 2-hydroxyethyl, methacrylic acid 2-hydroxypropyl, methacrylic acid 4-hydroxybutyl and mono (meth) acrylic acid ester of glycerin; an acrylic monomer having an epoxy group(s) in each molecule, such as glycidyl methacrylate, methylglycidyl methacrylate, 3,4-epoxycyclohexylmethyl methacrylate; an acrylic monomer having an allyl group(s) in each molecule, such as allyl acrylate and allyl methacrylate; an acrylic monomer having a hydrolyzable silyl group(s) in each molecule, such as γ-methacryloyloxypropyltrimethoxysilane and γ-methacryloyloxypropyltriethoxysilane; and an ultraviolet absorbing acrylic monomer having a benzotriazole-based UV-absorbing group(s), such as 2-(2-hydroxy-5-methacryloxyethylphenyl)-2H-benzotriazole.

In addition to the above acrylic monomers, the acrylic block copolymer as the component (D) may also further employ a monomer other than any of the above acrylic monomers. Examples of such monomer other than any of the above acrylic monomers include an aromatic vinyl compound such as styrene and α-methylstyrene; a conjugated diene such as butadiene and isoprene; and an olefin such as ethylene and propylene.

The acrylic block copolymer as the component (D) can be produced through a known or common production method of block copolymer. As a method for producing the above acrylic block copolymer(s), living polymerization (e.g. living radical polymerization, living anion polymerization and living cation polymerization) is preferred in terms of an ease of control over the molecular weight, molecular weight distribution and terminal structure of an acrylic block copolymer. The above living polymerization can be performed through a known or common method.

Further, the acrylic block copolymer as the component (D) is not limited to an AB-type diblock copolymer, but may also be, for example, an ABC-type or ABA-type triblock copolymer or a block copolymer having even more segments. Particularly, in terms of heat resistance and crack resistance, preferred is an AB-type diblock copolymer or ABA-type triblock copolymer in which a monomer mainly composing the A segment thereof is a methyl methacrylate monomer, and a monomer mainly composing the B segment thereof is an n-butyl acrylate monomer. Specifically, there may be used commercially available products by the product names of, for example, "Nanostrength M52N," "Nanostrength M22N," "Nanostrength M51," "Nanostrength M52" and "Nanostrength M53" (all produced by ARKEMA, PMMA-b-PBA-b-PMMA).

It is preferred that the acrylic block copolymer as the component (D) be added in an amount of 3 to 30 parts by mass, particularly preferably 5 to 20 parts by mass with respect to 100 parts by mass of the sum total of the components (A-1), (A-2), (A-3) and (A-4). When the amount of the component (D) added is smaller than 3 parts by mass, a desired strength and crack resistance of the cured product cannot be achieved. Further, an added amount of the component (D) larger than 30 parts by mass may lead to an impaired heat resistance and light resistance of the cured product of the epoxy resin composition, an impaired compatibility of the component (D) with the epoxy resin or curing agent, an impaired transparency of the cured product and a decreased glass-transition temperature of the cured product.

In addition to the components (A), (B), (C) and (D), the following components may also be added to the composition of the invention.

(E) Mold Release Agent

A mold release agent can be added to the composition of the invention. The mold release agent as a component (B) is added to improve mold releasability at the time of molding.

Examples of such mold release agent include a natural wax such as carnauba wax; and synthesized waxes such as acid wax, polyethylene wax and fatty acid ester. In general, many of these waxes will be easily subjected to yellowing and degradation with time when exposed to a high temperature and light irradiation environment, and will then lose their mold releasabilities accordingly. Moreover, a mold release agent will usually bleed on a resin surface, and will often significantly impair the transparency of the cured product even when used in a small amount. Therefore, glycerin derivatives and fatty acid esters are preferably used in terms of ensuring both transparency and mold releasability.

It is preferred that the mold release agent (E) be added in an amount of 0.20 to 10.0 parts by mass, particularly preferably 1.0 to 7.0 parts by mass, with respect to 100 parts by mass of the sum total of the component (A). A sufficient mold releasability may not be achieved if the mold release agent as the component (E) is added in an amount of smaller than 0.20 parts by mass. Further, an added amount of the component (E) greater than 10.0 parts by mass may lead to, for example, an insufficient transparency, bleeding failure and adhesion failure.

(F) Coupling Agent

A coupling agent such as a silane coupling agent and a titanate coupling agent may be added to the composition of the invention for the purpose of improving an adhesion strength to a metal base material such as a lead frame.

Preferable examples of such coupling agent include an epoxy functional alkoxysilane such as γ-glycidoxypropyltrimethoxysilane, γ-glycidoxypropylmethyldiethoxysilane and β-(3,4-epoxycyclohexyl)ethyltrimethoxysilane; and a mercapto functional alkoxysilane such as γ-mercaptopropyltrimethoxysilane. Here, although no particular limitation is imposed on an added amount of such coupling agent and a surface treatment method thereof, it is not preferable to use a type of coupling agent (e.g. amine-based silane coupling agent) causing a cured product to discolor when left at a temperature not lower than 150° C.

It is preferred that the component (F) be added in an amount of 0.05 to 2.0% by mass, more preferably 0.1 to 1.5% by mass, with respect to the component (A). An added amount of the component (F) smaller than 0.05% by mass may result in an insufficient adhesion to a base material. Further, an added amount of the component (F) greater than 2.0% by mass may lead to an extremely low viscosity such that voids may be formed.

(G) Other Component

There may also be added to the composition of the invention a flexibility imparting agent such as polycaprolactone polyol and polycarbonate polyol to toughen the cured product and improve the crack resistance thereof. A low-molecular polyol such as ethylene glycol, diethylene glycol and glycerin may be added to the composition of the invention in order to moderate the curing of the composition of the invention. Further, an inorganic filler such as a glass filler or a silica can also be added to the composition of the invention without impairing the transparency.

The composition of the invention is produced as follows. That is, each component of the component (A) is combined at given ratios, and the combined components are then prepolymerized as a result of being thermally mixed by a gate mixer or the like. Further, the component (B); and if necessary, the components (C), (D), (E) and/or (F) and so on are mixed with the prepolymerized component (A) at given ratios, followed by melting, and then cooling and solidifying the mixture before crushing the same into pieces of an appropriate size. There, the components may be added in any order. For example, while the component (C) or the like may be previously added at the time of prepolymerizing each component of the component (A), the component (C) or the like may also be mixed with each component of the component (A) from the start so as to make it easier for the component (D) to be melted. Moreover, each component of the component (A) alone may be previously prepolymerized, cooled and solidified, and then crushed into pieces of an appropriate size, followed by adding thereto the component (B) and if necessary, the optional component(s) at given composition ratios, and then using a mixer or the like to thoroughly and evenly mix the same. Next, a heated roll, a kneader, an extruder or the like may also be used to melt and mix the mixture thus obtained, followed by cooling and solidifying the melted mixture before crushing it into pieces of an appropriate size so as to obtain a molding material of the epoxy resin composition.

An optical semiconductor element using the composition of the invention can be encapsulated by a transfer molding method. It is preferred that a transfer molding machine be used to perform transfer molding under a molding pressure of 5 to 20 N/mm², at a molding temperature of 120 to 190° C. for a molding time of 30 to 500 sec, particularly preferably at a molding temperature of 150 to 185° C. for a molding time of 90 to 300 sec. Further, secondary curing may also be performed at 150 to 185° C. for 0.5 to 20 hours.

WORKING EXAMPLE

The present invention is described in detail hereunder with reference to working and comparative examples. However, the present invention is not limited to the following working examples.

Raw materials used in the working and comparative examples are as follows.

(A): Prepolymer
- (A-1): Triazine derivative epoxy resin having not less than three epoxy groups in one molecule
  - (A-1-1): Tris(2,3-epoxypropyl)isocyanurate (product name: TEPIC-S by Nissan Chemical Industries, Ltd., epoxy equivalent 100)
- (A-2): Epoxy resin other than (A-1), non-fluid at 25° C.
  - (A-2-1): Solid bisphenol A type epoxy resin (product name: jER-1001 by Mitsubishi Chemical Corporation, epoxy equivalent 475, softening temperature 64° C.)
  - (A-2-2): Solid alicyclic epoxy resin (product name: EHPE-3150 by Daicel Corporation, epoxy equivalent 170, melting point 75 to 95° C.)
- (A-3): Cyclic or linear siloxane compound having not less than two epoxy groups in one molecule
  - (A-3-1): Cyclic siloxane compound having four epoxy groups in one molecule (product name: X-40-2670 by Shin-Etsu Chemical Co., Ltd., epoxy equivalent 200)
  - (A-3-2): Linear siloxane compound having two epoxy groups in one molecule (product name: KF-105 by Shin-Etsu Chemical Co., Ltd., epoxy equivalent 490)
- (A-4): Acid anhydride liquid at 25° C.
  - (A-4-1): methylhexahydrophthalic anhydride (product name: RIKACID MH by New Japan Chemical Co., Ltd., acid anhydride equivalent 168, viscosity 49 mPa·s at 25° C.)

(B): Curing Agent (B-1) Tetra-n-butylphosphonium tetraphenylborate (product name: HISHICOLIN PX-4PB by Nippon Chemical Industrial CO., LTD.)

(C): Antioxidant (C-1) Phosphorous antioxidant (product name: PEP-8 by ADEKA CORPORATION)

(D): Acrylic Block Copolymer (D-1) Acrylic block copolymer (product name: Nanostrength M52N by ARKEMA)

Working Examples 1 to 5; Comparative Examples 1 to 4

The components (A-1), (A-2), (A-3) and (A-4); and if necessary, (C) and (D) were combined at the ratios shown in Table 1, followed by melting and mixing them in a gate mixer that had been heated to 85° C., for 6 hours so as to prepolymerize the same. Later, the component (B) was added into the prepolymer to further perform melting and mixing for 5 min, followed by cooling and solidifying a product thus prepared before crushing the same. Thus, there was obtained a target powdery epoxy resin composition.

Comparative Example 5

In addition to the components (A-1), (A-2), (A-3), (A-4), (C) and (D), the component (B) was added at the ratio shown in Table 1, followed by melting and mixing them in a gate mixer that had been heated to 110° C., for 10 min, and then cooling a product thus prepared. Thus, there was obtained a paste-like epoxy resin composition.

The following properties were evaluated with regard to these compositions. The results thereof are shown in Table 1.

Handling Property of Composition

Evaluated based on the following criteria was a workability at the time of performing melting and mixing using the above gate mixer ○: Easily tabletable composition was obtained after cooling.

× Only composition difficult to be tableted was obtained after cooling

Bending Strength and Bending Elastic Modulus at Room Temperature/260° C.

Transfer molding was performed under conditions of molding temperature: 175° C.; molding pressure: 6.9 N/mm$^2$; and molding time: 120 sec, using a mold manufactured in accordance with the standard as set forth in JIS K6911:2006. Secondary curing was later performed at 180° C. for an hour. A bending strength and bending elastic modulus of a secondarily cured specimen were then measured at room temperature (25° C.) and at a temperature of 260° C.

Glass-Transition Temperature (Tg)

A mold manufactured in accordance with the EMMI standard was used to perform transfer molding under conditions of molding temperature: 175° C.; molding pressure: 6.9 N/mm$^2$; and molding time: 120 sec, followed by performing secondary curing at 180° C. for an hour. A secondarily cured specimen was then measured by TMA (TMA 8310 by Rigaku Corporation).

Light Transmission Before and after Heat Treatment

Transfer molding was performed under conditions of molding temperature: 175° C.; molding pressure: 6.9 N/mm$^2$; and molding time: 120 sec to produce a sheet-like cured product of a thickness of 1 mm, followed by using a spectrophotometer CMS-35SPC (by Murakami Color Research Laboratory) to measure a light transmission at 600 nm of such cured product that had not yet been subjected to a heat treatment. A heat treatment was then performed at 150° C. for 1,000 hours, followed by measuring a light transmission after performing such heat treatment in a similar manner as that for measuring the light transmission prior to the heat treatment.

According to the results shown in Table 1, it was confirmed that prepolymerization made it possible to perform pressure molding (tableting) at room temperature. Moreover, it was confirmed that the cured product of the composition containing the cyclic siloxane compound having not less than two epoxy groups in one molecule exhibited a high light transmission; and a high strength and elastic modulus not only under room temperature, but also in a high temperature state. In addition, by adding the cyclic siloxane compound having not less than two epoxy groups in one molecule, the light transmission is hardly impaired such that a transparency can be maintained; and the heat resistance can be improved.

TABLE 1

| | | | | | Working example | | | | | Comparative example | | | | |
|---|---|---|---|---|---|---|---|---|---|---|---|---|---|---|
| | | Composition table (part by mass) | | | 1 | 2 | 3 | 4 | 5 | 1 | 2 | 3 | 4 | 5 |
| (A) | (A-1) | Epoxy resin | TEPTC-s | A-1-1 | 31.5 | 29.8 | 31.5 | 29.8 | 31.5 | 31.5 | 31.5 | 31.5 | 31.5 | 31.5 |
| | (A-2) | Epoxy resin | jER-1001 | A-2-1 | 13.5 | 12.7 | | | 13.5 | 13.5 | 13.5 | | 13.5 | 13.5 |
| | | | EHPE-3150 | A-2-2 | | | 13.5 | 12.7 | | | 13.5 | | | |
| | (A-3) | Siloxane compound | X-40-2670 | A-3-1 | 6.0 | 9.0 | 6.0 | 9.0 | 6.0 | | | | | 6.0 |
| | | | KF-105 | A-3-2 | | | | | | 6.0 | 6.0 | | | |
| | (A-4) | Acid anhydride | RTK ACID MH | A-4-1 | 49.0 | 51.5 | 49.0 | 51.5 | 49.0 | 49.0 | 49.0 | 50.0 | 50.0 | 49.0 |
| (B) | | Curing accelerator | HISHICOLIN PX-4PB | B-1 | 0.2 | 0.2 | 0.2 | 0.2 | 0.2 | 0.2 | 0.2 | 0.2 | 0.2 | 0.2 |
| (C) | | Antioxidant | PEP-8 | C-1 | 0.2 | 0.2 | 0.2 | 0.2 | | 0.2 | 0.2 | 0.2 | 0.2 | 0.2 |
| (D) | | Acrylic block copolymer | Nanostrength M52N | D-1 | 3.0 | 3.0 | 3.0 | 3.0 | | 3.0 | 3.0 | | 3.0 | 3.0 |
| Condition | | Prepolymerization | | | Yes | Yes | Yes | Yes | Yes | Yes | Yes | Yes | Yes | No |
| | | Handling Property of composition | | | ○ | ○ | ○ | ○ | ○ | ○ | ○ | ○ | ○ | × |
| | Room temperature(25° C.) | Bending strength | | MPa | 100 | 105 | 90 | 90 | 110 | 75 | 59 | 71 | 102 | Failed to cure |
| | | Bending elastic modulus | | MPa | 2600 | 2500 | 2800 | 2700 | 2700 | 2800 | 3000 | 1600 | 1500 | |
| Evaluation result | High temperature(260° C.) | Bending strength | | MPa | 2.2 | 2.9 | 4.5 | 6.0 | 3.5 | 1.5 | 1.9 | 1.5 | 1.3 | |
| | | Bending elastic modulus | | MPa | 43 | 51 | 71 | 86 | 63 | 21 | 15 | 19 | 16 | |
| | | Glass-transition temperature | | ° C. | 175 | 182 | 185 | 186 | 175 | 145 | 150 | 165 | 165 | |
| | | Light transmission before heat treatment (150° C. for 1,000 hours) | | % | 92 | 92 | 93 | 94 | 92 | 25 | 28 | 92 | 92 | |
| | | Light transmission after heat treatment (150° C. for 1,000 hours) | | % | 80 | 82 | 76 | 80 | 70 | 20 | 24 | 72 | 74 | |

What is claimed:

1. A heat-curable epoxy resin composition for optical semiconductor element encapsulation capable of being pressure molded and transfer molded under room temperature, comprising:
   (A) a prepolymer obtained by reacting at least one component of (A-1), (A-2) and (A-3); (A-4); and (D),
   (A-1) a triazine derivative epoxy resin having not less than three epoxy groups in one molecule,
   (A-2) at least one epoxy resin that is non-fluid at 25° C. and selected from the group consisting of a bisphenol-type epoxy resin, a hydrogenated bisphenol-type epoxy resin, an alicyclic epoxy resin and monoalkyl diglycidyl isocyanurate,
   (A-3) a cyclic siloxane compound having not less than two epoxy groups in one molecule,
   (A-4) an acid anhydride curing agent which is an acid anhydride curing agent in a liquid state at 25° C.; or a liquid mixture prepared by dissolving an acid anhydride in a solid state at 25° C. into an acid anhydride in a liquid state at 25° C., and
   (D) an acrylic block copolymer,
   wherein a ratio of a total number of epoxy groups in (A-1), (A-2) and (A-3) to a total number of acid anhydride groups in (A-4) is 0.6 to 2.0, wherein at least one of components (A-1), (A-2) and (A-3) is reacted with component (A-4) to prepare (A);
   (A') all of component(s) among (A-1) to (A-3) that is/are not used in said prepolymer (A), said component(s) (A-1), (A-2) and (A-3) being optional if all of said components (A-1), (A-2) and (A-3) are reacted with component (A-4) to prepare (A); and
   (B) a curing accelerator.

2. The heat-curable epoxy resin composition for optical semiconductor element encapsulation according to claim 1, wherein said prepolymer (A) is obtained by reacting at least one component of (A-1), (A-2) and (A-3); (A-4); (D); and an antioxidant as a component (C).

3. An optical semiconductor device having an optical semiconductor element encapsulated by the heat-curable epoxy resin composition for optical semiconductor element encapsulation as set forth in claim 2.

4. An optical semiconductor device having an optical semiconductor element encapsulated by the heat-curable epoxy resin composition for optical semiconductor element encapsulation as set forth in claim 1.

* * * * *